(12) United States Patent
Yu et al.

(10) Patent No.: US 11,775,218 B2
(45) Date of Patent: *Oct. 3, 2023

(54) MANAGEMENT OF POWER DURING MEMORY DEVICE RESET AND INITIALIZATION

(71) Applicant: Micron Technology, Inc., Boise, ID (US)

(72) Inventors: Liang Yu, Boise, ID (US); Jonathan Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/549,181

(22) Filed: Dec. 13, 2021

(65) Prior Publication Data

US 2022/0100431 A1 Mar. 31, 2022

Related U.S. Application Data

(63) Continuation of application No. 16/875,464, filed on May 15, 2020, now Pat. No. 11,200,001.

(51) Int. Cl.
*G06F 3/06* (2006.01)
*G11C 16/26* (2006.01)
*G11C 16/04* (2006.01)

(52) U.S. Cl.
CPC .......... *G06F 3/0659* (2013.01); *G06F 3/0604* (2013.01); *G06F 3/0673* (2013.01); *G11C 16/26* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 6,256,252 B1 * | 7/2001 | Arimoto | G11C 7/22 365/228 |
| 6,349,068 B2 | 2/2002 | Takemae et al. | |
| 7,039,755 B1 * | 5/2006 | Helms | G11C 11/406 365/222 |
| 8,060,767 B1 * | 11/2011 | Wright | H02M 1/08 713/323 |
| 8,120,393 B2 | 2/2012 | Choi | |
| 8,725,975 B2 | 5/2014 | Moyer | |
| 8,780,662 B2 | 7/2014 | Lee | |
| 9,335,809 B2 * | 5/2016 | Younger | G06F 1/3206 |
| 9,377,957 B2 | 6/2016 | Chen | |
| 9,424,896 B2 | 8/2016 | Groot | |
| 10,037,072 B2 | 7/2018 | Zhou et al. | |
| 2011/0128977 A1 * | 6/2011 | Suzuki | G06F 13/4239 370/498 |
| 2014/0078850 A1 * | 3/2014 | Eguchi | H03K 17/22 327/143 |
| 2016/0365127 A1 * | 12/2016 | Chun | G11C 5/148 |

* cited by examiner

*Primary Examiner* — Elias Mamo
(74) *Attorney, Agent, or Firm* — Lowenstein Sandler LLP

(57) ABSTRACT

A system to send a first command to execute an initialization process on a first memory die of a plurality of memory dies of a memory sub-system. The system reads a bit value indicating that the first memory die is executing a low peak current draw phase of the initialization process. In response to reading the bit value, sending a second command to a second memory die of the plurality of memory dies of the memory sub-system, the second command to execute the initialization process on the second memory die.

20 Claims, 7 Drawing Sheets

MANAGEMENT OF POWER DURING MEMORY DEVICE RESET AND INITIALIZATION

CROSS-REFERENCE TO RELATED APPLICATION

This application is a continuation of U.S. patent application Ser. No. 16/875,464, filed on May 15, 2020, the entirety of which is hereby incorporated by reference herein.

TECHNICAL FIELD

Embodiments of the disclosure relate generally to memory sub-systems, and more specifically, relate to management of power during memory device reset and initialization.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
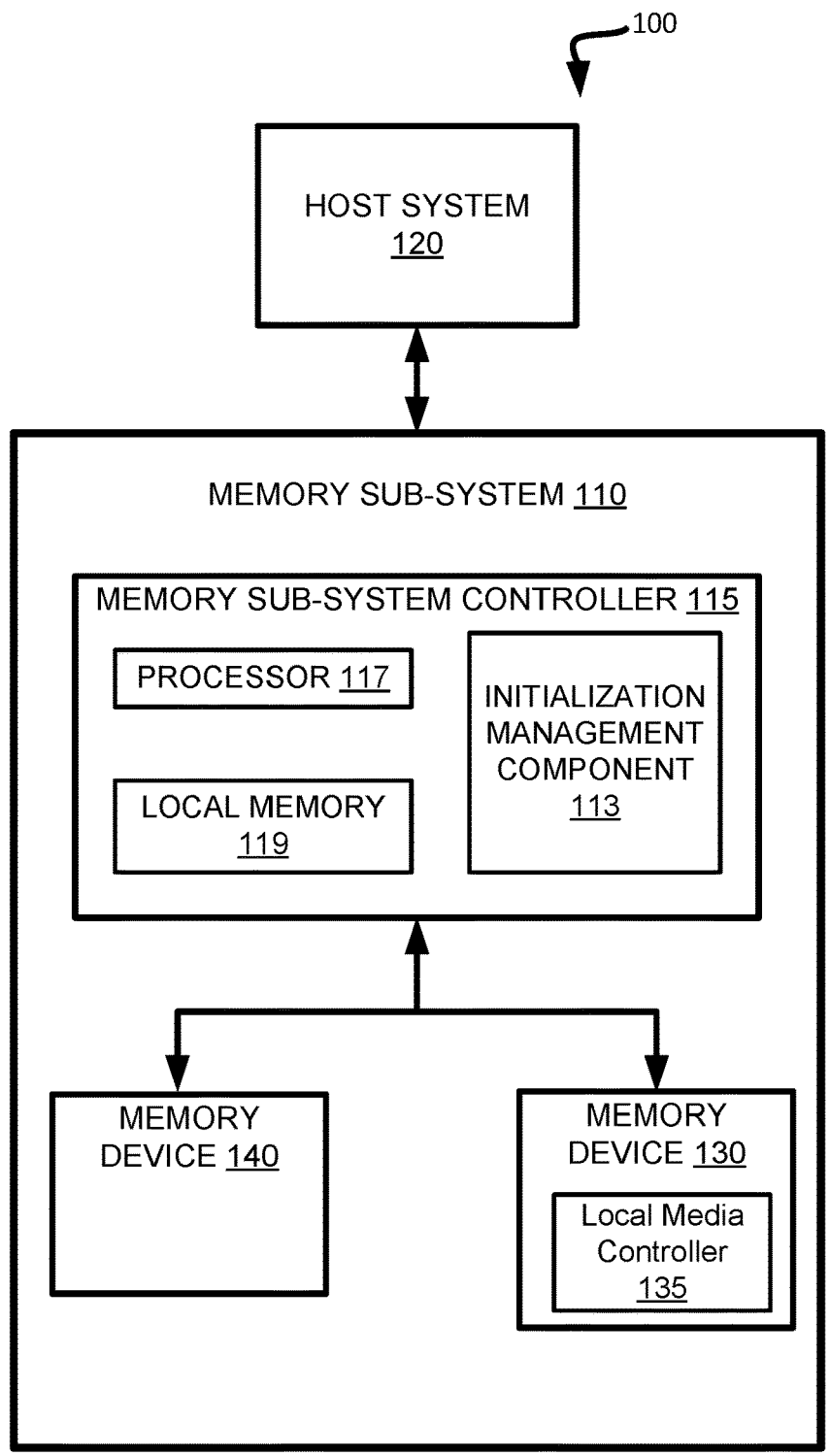
FIG. 1 illustrates an example computing system that includes a memory sub-system in accordance with some embodiments of the present disclosure.

Aspects of the present disclosure are directed to power management during memory device reset and initialization in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include memory devices including multiple memory dies. During a powering up operation, the multiple memory dies go through a reset and initialization phase during which various operational settings (e.g., threshold voltage levels) are identified and loaded into storage of the memory die (e.g., a latch of the memory die). The initialization phase includes multiple operations and sub-operations (e.g., charge pump initialization, word line ramp up, bit line charges, etc.) that produce peak current events. In certain instances, multiple memory dies execute the initialization phase at the same time, resulting in the overall power and current consumption to exceed peak requirements established for the memory sub-system.

One approach to managing power consumption during initialization is to reduce each peak power event by slowing down individual memory die performance. This approach may only be employed for memory dies that operate on a same channel using multi-die select (MDS) pad bonding information. The individual memory units are addressed in the memory device using the MDS, where each individual memory die is addressable using a unique address (e.g., a logical unit number (LUN) address) that is generated based on a number of chip enable (CE) inputs (e.g., control input or signal associated with operation of an integrated circuit) in the memory device and a number of memory dies per chip enable input. In this configuration, each memory die of a channel is assigned a predetermined delay value to apply during the initialization phase. For example, a first memory die associated with a first LUN address is assigned a predetermined delay value of five microseconds and a second memory die associated with a second LUN address is assigned a predetermined delay value of ten microseconds, and so on. Accordingly, multiple memory dies associated with different LUN addresses may apply different delay times on the same channel in response to receiving the initialization command at same time. However, various memory devices do not use shared CE inputs with MDS bonding. Instead, many memory sub-systems employ individual CE control for each memory die. Accordingly, the aforementioned approach, which is limited to MDS configurations, cannot be applied.

Another approach to managing power consumption during initialization of multiple memory dies is to stagger an initialization time or trim load time associated with each memory die. In this approach, a system controller manually staggers individual CE delay times when issuing initialization commands to the respective memory dies. However, the resulting staggering is inaccurate and fails to ensure the peak power levels produced during the initialization phase by each memory die are staggered efficiently due to process, temperature, voltage (PVT) shifts and corresponding overhead delay, particularly when the memory dies continue to update the operations performed as part of the initialization process. In such cases, the PVT shifts cause the peak current timing in delayed memory dies to shift, thereby causing peak current overlap by the multiple memory dies.

Aspects of the present disclosure address the above and other deficiencies by a memory sub-system configured to manage peak current levels of a set of multiple memory dies during execution of a reset and initialization process. The initialization process can include multiple phases (e.g., one or more groups of operations or sub-operations) performed by the memory die. In an embodiment, each of the multiple memory dies of a set of memory dies to be initialized maintain a status register (SR) including a bit (herein referred to as a "phase bit") that can be read by a controller of the memory sub-system to determine if an initialization command can be sent to another memory die (e.g., a next memory die) in the set of memory dies.

The controller of the memory sub-system maintains read capability of the phase bit of each memory die to enable the phase bit to be polled or read to identify the bit value. For example, a memory die can set the bit to a first bit value (e.g., a value of "1") indicating that the memory die is executing a phase of the initialization process associated with one or more peak current events (e.g., a risky or sensitive phase or portion of the initialization, also referred to as "peak current phase"). In response to a polling operation, the controller reads the first bit value and determines that an initialization command should not be sent to a next memory die. In an embodiment, the one or more peak current phases of the initialization process (e.g., the sensitive or risky phases) can be predetermined during a characterization phase of the memory dies. In an embodiment, the one or more peak current phases can be detected by the memory sub-system during operation based on changes to the operational parameters of the memory dies, such as PVT changes.

As the memory die completes or exits the one or more peak current phases, the memory die can enter into one or more phases that do not include a peak current event (also referred to as a "safe phase" of the initialization process). The one or more safe phases of the initialization process represent a "valid window" during which the initialization process can be performed on multiple memory dies in parallel without overlapping peak current events. In response to entering a safe phase, the memory die can set or toggle the bit value to a second value (e.g., a value of "0") indicating to the controller that the initialization command can be sent to a next memory die.

In an embodiment, a memory sub-system can include a set of multiple memory dies having a shared ready/busy (RB) output. The memory dies can provide a signal via the RB output to indicate a first value (e.g., a low status or value) indicating one or more of memory dies is executing a peak current phase of the initialization process (e.g., a high peak current draw). The RB output signal can indicate a second value (e.g., a high status or value) if the memory dies are executing safe phases of the initialization process (e.g., a low peak current draw). Accordingly, during memory die initializations, the shared RB output (e.g., the shared RB bus connected to the controller) can indicate a high status (e.g., the second value) while all of the memory dies are in low peak power phases, indicating a valid window for the controller to start the initialization process on a next memory die. Advantageously, management of the power consumption during the reset and initialization processing of multiple memory dies enables improved accuracy in the staggering of peak current events.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. Additional details relating to the example computing system 100 are described in greater detail below with reference to FIG. 3.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device. In an embodiment, each memory die can include an on-die logic controller that controls the sequence and timing of operations (e.g., write, read, verify, etc.) within the memory die.

The memory sub-system 110 includes an initialization management component 113 to manage peak power events of a set of multiple memory dies of one or more memory devices 130, 140 of the memory sub-system 110 during execution of a reset and initialization process including multiple phases. In an implementation, the initialization management component 113 can be hardware logic or a firmware implementation that enables the memory sub-system controller 115 to perform the power management functions described herein (e.g., the operations shown in FIG. 2 below). The phases of the initialization process can include sets or groups of one or more sub-operations. The initialization process includes one or more phases that produce peak current events (referred to as a "peak current phase") and one or more phases that do not include a peak current event (also referred to as a "safe phase"). Each of the multiple memory dies maintains a status register (SR) bit that can be set to a first value to indicate the memory die is processing a peak current phase or set to a second value to indicate the memory die is processing a safe phase. The phase bit can be read by the initialization management component 113 to determine if an initialization command can be sent to another memory die (e.g., a next memory die) in the set of memory dies.

As a memory die completes or exits the one or more peak current phases of the initialization process, the memory die can enter into a "safe phase" of the initialization process. The initialization management component 113 can read the new bit value indicating that the memory die is in a valid window during which the initialization process can be executed on multiple memory dies in parallel without overlapping peak current events. In view of the identification of the bit value set by a first memory die indicating operation in the safe phase, the initialization management component 113 determines a command to a next memory die to execute the initialization process. Advantageously, the setting and reading of the phase bit can be used by the initialization management component 113 to stagger the peak current events associated with the reset and initialization of multiple memory dies.

In an embodiment, the peak current phases and safe phases of the initialization process can be predetermined and predefined during a characterization phase of the memory dies. In an embodiment, the memory dies can be configure to perform the characterization to identify whether the memory die is in a peak current phase or a safe phase. In an embodiment, the peak current phases and safe phases can be determined by the initialization management component 113 by detecting and measuring parameter values associated with the initialization process. In an embodiment, the initialization management component 113 can detect PVT levels (e.g., voltage levels and temperature levels) in each memory die and compare to limit or threshold values (e.g., voltage threshold level, a temperature threshold level, etc.) to detect peak power phases (e.g., phases including measured parameter values that exceed the corresponding threshold value).

In an embodiment, the phase bit (e.g., bit2 of the status register) toggles from a first value (e.g. a value of "0" associated with the peak power phase) to a second value (e.g. a value of "1") when the memory die transitions from a peak power phase to a safe phase. Advantageously, the initialization management component 113 identifies a timeslot (e.g., a timeslot corresponding to the one or safe phases) for each memory die during which the initialization management component 113 can send a command to a next memory die to execute the initialization process to efficiently stagger the peak current events produced during initialization.

In an embodiment, the initialization management component 113 can read or receive a signal from a ready/busy (RB) output shared by multiple memory dies to determine whether a memory die is in a peak current stage of the initialization process. In this embodiment, the composite RB output signal can provide a signal indicating a first value (e.g., an "active high" or "0" value) if any one of memory dies sharing the RB output is executing a peak current phase of the initialization process (e.g., a high peak current draw). In an embodiment, the first value indicates that the memory die is in a high power mode (e.g., executing one or more peak current phases). The composite RB output signal can indicate a second value (e.g., an active low or "1" value) if all of the memory dies associated with the shared RB output signal are executing safe phases of the initialization process (e.g., a low peak current draw). In this embodiment, the active low states represent a low power window (or "valid window") during which the initialization management component 113 can start the initialization process on a next memory die. In an embodiment, each memory die can provide an active high or an active low value to the initialization management component 113 via the RB output to enable the initialization management component 113 to determine the composite value (e.g., active high or active low) for the multiple memory dies sharing the RB output. In an embodiment, the RB output is configured to combine all of the signals from the multiple memory dies and provide a single composite signal representing the active high or active low state to the initialization management component 113.

Figure 2:
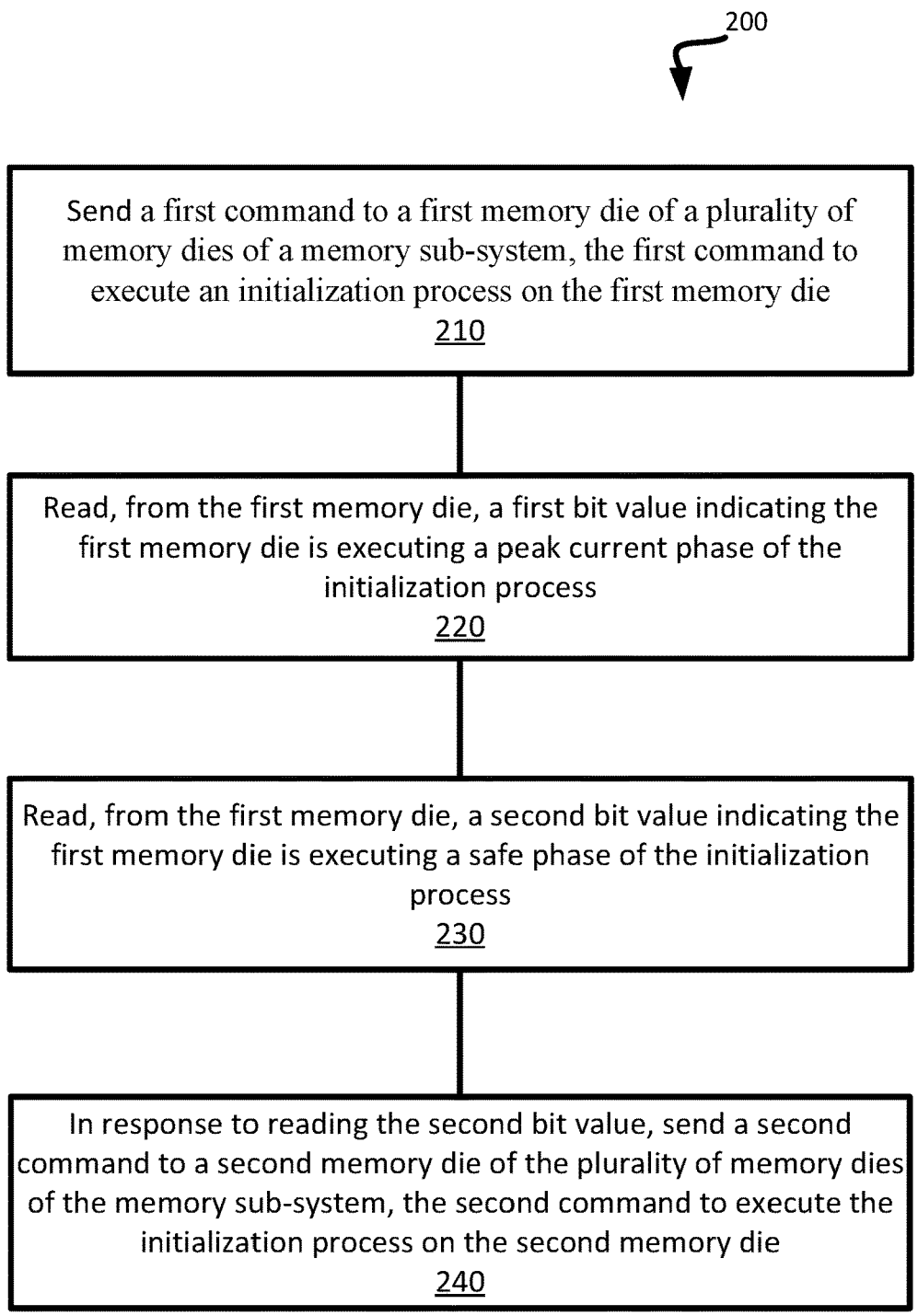
FIG. 2 is a flow diagram of an example method to manage execution of an initialization process by multiple memory dies of a memory sub-system in accordance with some embodiments.
Figure 3:
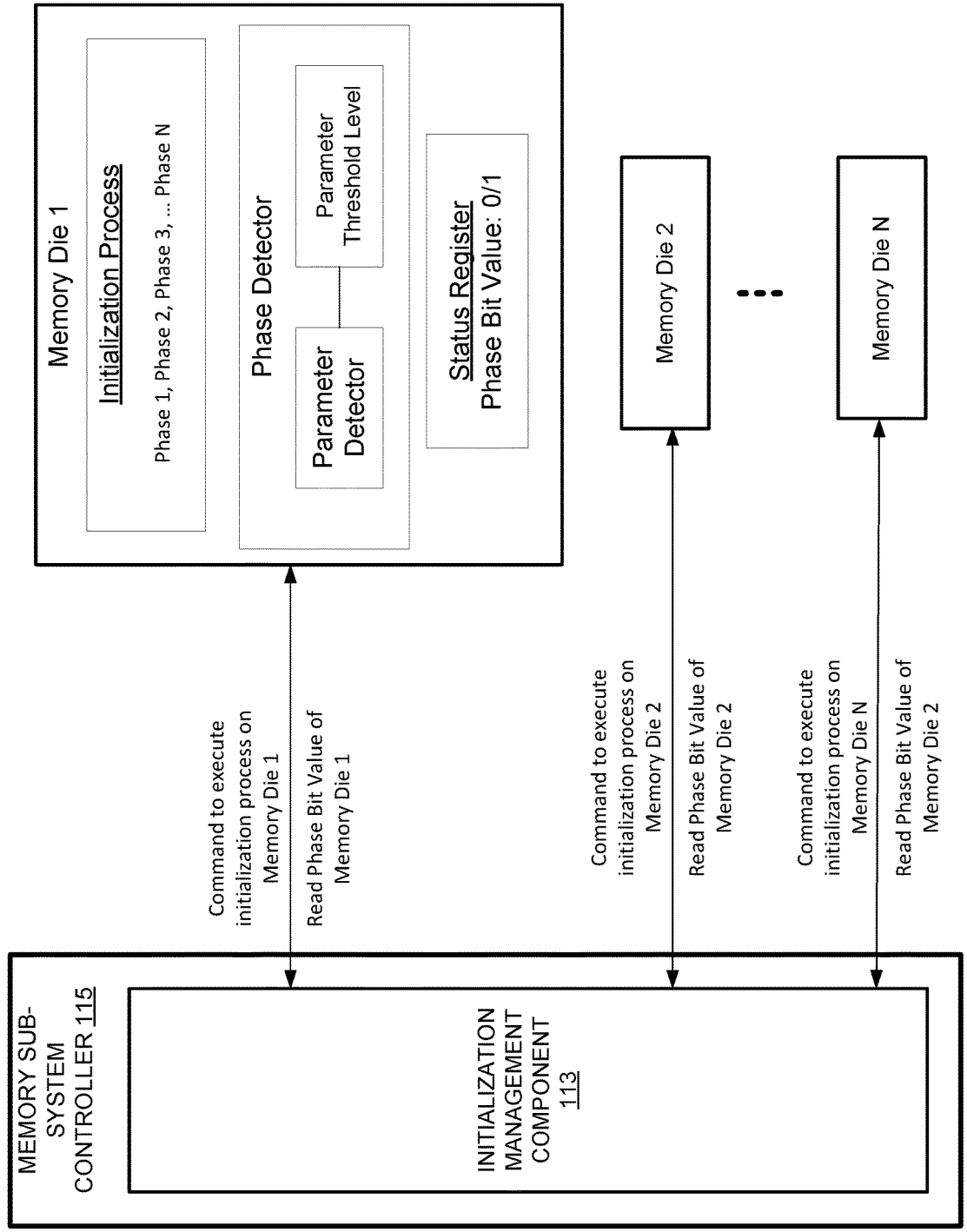
FIG. 3 illustrates an example system including an initialization management component configured to send initialization commands to multiple memory dies in view of a phase bit value in accordance with some embodiments.

FIG. 2 is a flow diagram of an example method 200 to manage power levels of multiple memory dies during execution of a reset and initialization process. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the initialization management component 113 of FIG. 1. In addition, FIG. 3 illustrates an example memory sub-system 115 including an initialization management component 113 configured to perform the operations of method 200. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic (e.g., processor 117 of FIG. 1, the initialization management component 113 of FIGS. 3, 4, and 5) sends a first command to execute an initialization process to a first memory die of a plurality of memory dies of a memory sub-system. In an embodiment, the initialization process includes multiple phases (e.g., sets of operations or sub-operations) which result in the consumption of power. In an embodiment, the first memory die initiates execution of the initialization process (e.g. phase 1 of the initialization process) in response to the command.

At operation 220, the processing logic reads a first bit value indicating that the first memory is executing a peak current phase of the initialization process. In an embodiment, one or more peak current phases of the initialization process result in a peak current level that exceeds a threshold peak current level. In an embodiment, each memory die maintains a status register (SR) including a bit (referred to as the "phase bit") for which a value can be set to indicate if the memory die is in a peak current phase. In an embodiment, the first bit value indicating the peak current phase can be a value of "1" indicating an active high mode during a window when it is invalid for the initialization management component 113 to send a command to start the initialization process to a next memory die.

FIG. 3 illustrates an example memory sub-system controller 115 including an initialization management component 113 managing execution of an initialization process by a set of multiple memory dies (e.g., Memory Die 1, Memory Die 2 . . . Memory Die N) in view of the phase bit value.

In an embodiment, one or more peak current phases of the initialization process can be identified and designated during a characterization phase of the first memory die. In this embodiment, the one or more peak current phases during which one or more peak current events are produced are predetermined and stored to enable identification by the memory die. Accordingly, the memory die can recognize entry into a peak current phase and set the phase bit value to the corresponding value.

In another embodiment, the first memory die can include one or more parameter detectors (e.g., PVT detectors) to measure one or more parameter values during execution of the initialization process. As shown in FIG. 3, the first memory die can determine whether a phase of the initialization process that is being executed is a peak current phase by determining if one or more parameter levels change as compared to the one or more parameter threshold levels. In an embodiment, one or more parameter levels changes can be detected to identify the entering and exiting of a peak current phase.

At operation 230, the processing logic reads a second bit value indicating the first memory die is executing a safe phase of the initialization process. In an embodiment, a safe phase is a phase of the initialization process during which no peak current events occur. In an embodiment, the first memory die (e.g., Memory Die 1 in FIG. 3) can set or toggle the phase bit from the first bit value (indicating the peak current phase) to a second bit value indicating one or more safe phases. In an embodiment, the second bit value indicating the one or more safe phases can be a value of "0" indicating an active low mode during a window when it is valid for the initialization management component 113 to send a command to start the initialization process to a next memory die. In an embodiment, operation 230 occurs after execution of operation 220.

In an embodiment, the one or more safe phases of the initialization process can be identified and flagged during the characterization phase associated with the memory die. In another embodiment, the one or more parameter value detectors can be used to determine parameter changes indicating entry and exit into and from a safe phase. In an embodiment, as shown in FIG. 3, the parameter detector can detect or measure one or more parameter values (e.g., PVT values) and compare those values to a parameter threshold level to determine a comparison result. In an embodiment, if the comparison result satisfies a condition, the phase detector can determine if a phase is a safe phase.

At operation 240, in response to reading the second bit value, the processing logic sends a second command to execute the initialization process to a second memory die of the plurality of memory dies of the memory sub-system. As shown in FIG. 3, reading the second bit value identifying the one or more safe phases indicates to the initialization management component 113 that the command to start execution of the initialization process can safely be sent to next memory die (e.g., Memory Die 2 of FIG. 3). In an embodiment, this process can be repeated with respect to Memory Die 2 to identify when Memory Die 2 is in a safe phase and the command to start the initialization process can be sent to a next memory die until a last memory die is reached (e.g., Memory Die N).

Figure 4:
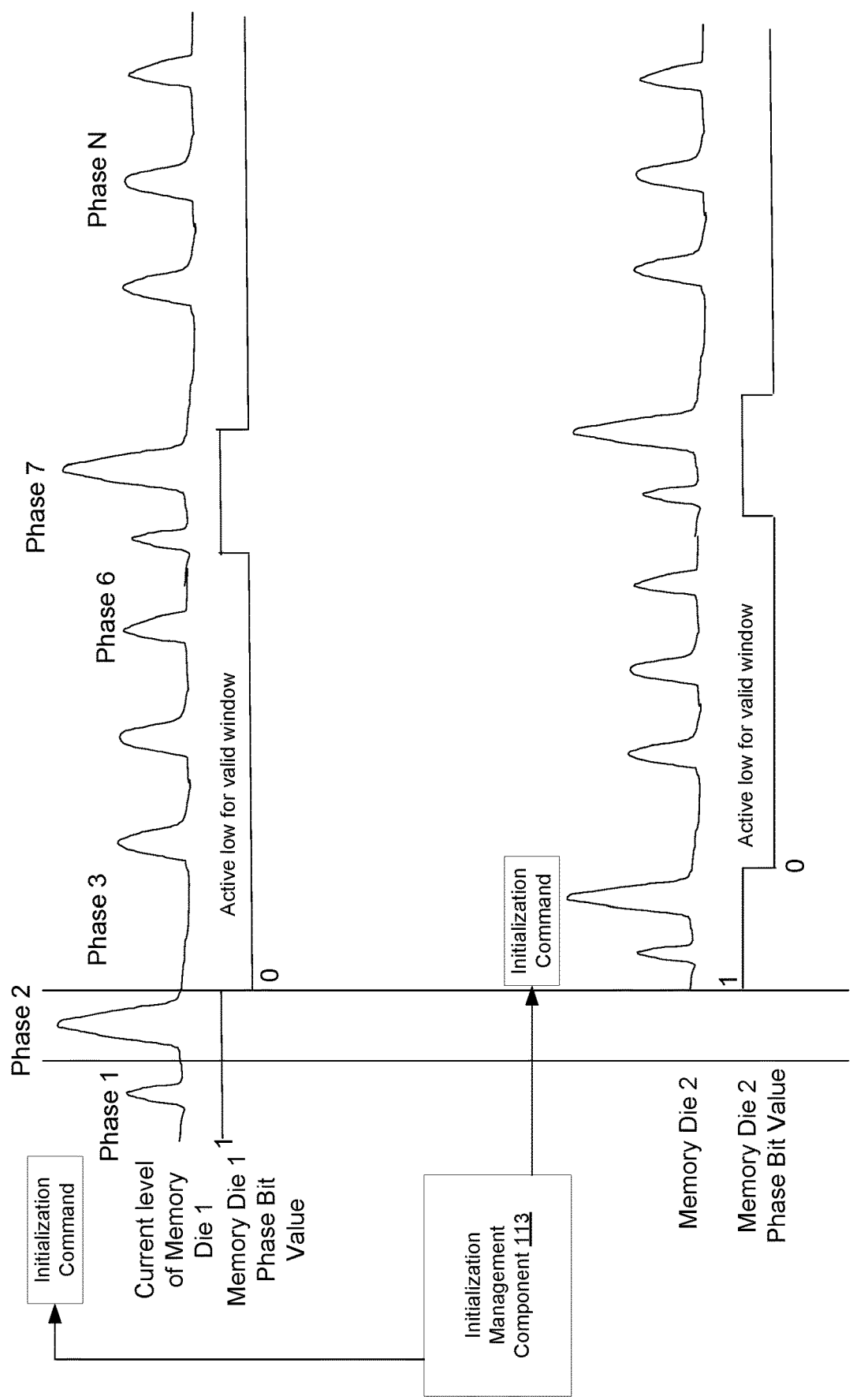
FIG. 4 illustrates a setting of a phase bit value corresponding to phases of an initialization process executed by multiple memory dies in accordance with some embodiments.

FIG. 4 illustrates an initialization management system 113 managing execution of an initialization process including multiple phases (e.g., Phase 1 through Phase N) by a set of memory dies (e.g., Memory Die 1 and Memory Die 2), according to embodiments of the present disclosure. As shown in FIG. 4, the initialization management system 113 sends a command to Memory Die 1 to start execution of the initialization process. Memory Die 1 sets a phase bit value to a first bit value (e.g., "1") to indicate the start of the initialization process and identification of a peak current phase (e.g., Phase 2). The current level of Memory Die 1 changes as a result of the corresponding phases such that the current level is below a threshold value during safe phases and above a threshold value during peak current phases (e.g., phases including one or more peak current events).

As shown in FIG. 4, following completion of phase 2 and entry into one or more safe phases (e.g., phase 3 through phase 6), memory die 1 sets the phase bit value to "0". In the illustrated embodiment, the active low mode (e.g., a phase bit value of "0") indicates the valid window for the initialization management component 113 to send a next initialization command. In alternative embodiments, the active high mode (e.g., a phase bit value of "1"). As illustrated, the sending of the command to Memory Die 2 is staggered relative to the start of the initialization process by Memory Die 1 and avoids overlapping peak current phases during the parallel execution of the initialization process by the multiple memory dies.

Figure 5:
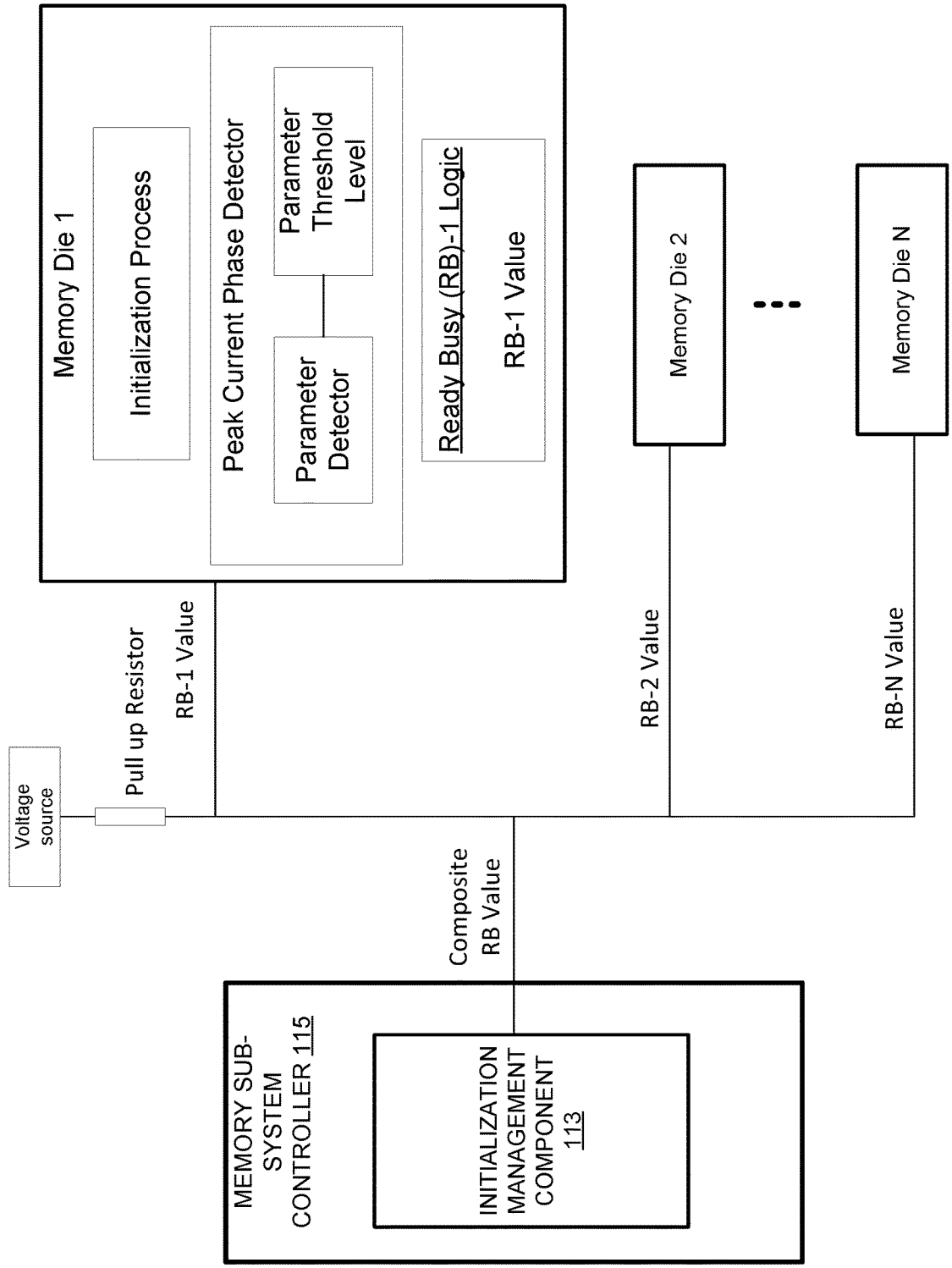
FIG. 5 illustrates an example system including an initialization management component configured to send initialization commands to multiple memory dies in view of a ready busy logic output value in accordance with some embodiments.

FIG. 5 illustrates an example memory sub-system controller 115 including an initialization management component 113 managing execution of an initialization process by a set of multiple memory dies (e.g., Memory Die 1, Memory Die 2 . . . Memory Die N) in view of a read busy (RB) logic signal. As shown in FIG. 5, multiple memory dies (e.g., Memory Die 1, Memory Die 2 . . . Memory Die N) are connected to the initialization management component 113 via a shared RB connection. In an embodiment, each memory die can set a first value (e.g., a value of "1") for the RB indicating the memory die is executing a safe phase. In an embodiment, each memory die can set a second RB value (e.g., a value of "0") indicating the memory die is executing a peak current phase.

Figure 6:
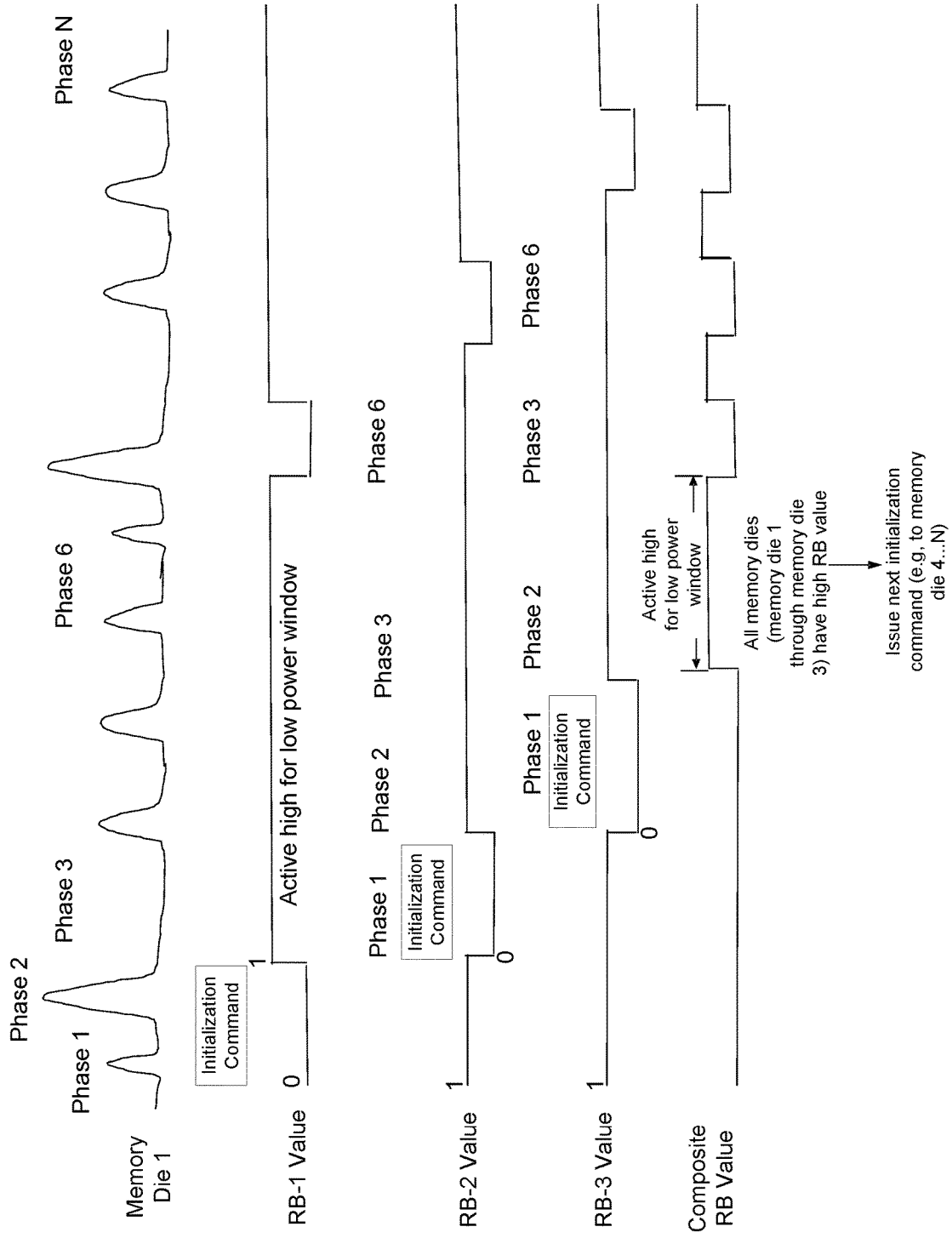
FIG. 6 illustrates setting a ready busy logic output value corresponding to phases of an initialization process executed by multiple memory dies in accordance with some embodiments.

In an embodiment, the initialization management component 113 identifies a composite RB value based on the respective RB values of the memory dies (e.g., RB-1 value for Memory Die 1, RB-2 Value for Memory Die 2, and RB-N Value for Memory Die 3), as shown in FIG. 6. In an embodiment, the active high mode (e.g., RB value of 1) indicates a low power or valid window for the sending of an initialization command to a next memory die. In this embodiment, the active low mode (e.g., RB value of 0) indicates a high power window corresponding to a peak current phase.

In an embodiment, the RB logic of the multiple memory dies can be connected together with a common pull up resistor to a voltage source, with each RB output as an open drain circuit. In an embodiment, the initialization management component 113 can identify a low output (e.g. an RB value of 0) for a peak current phase and identify a high output for a safe phase. As shown in FIG. 6, the composite RB value is set to a low value (e.g., the value of 0) if any one of RB values of the memory dies has a low value (e.g., RB-1 equals 0, RB-2 equals 0 or RB-N equals 0) due to the execution of a peak current phase. Furthermore, the composite RB value is set to a high value (e.g., the first RB value of 1) when all of the memory dies are executing safe phases (e.g., RB-1 equals 1, RB-2 equals 1, and RB-N equals 1), thus indicating a valid window for sending a command to a next memory die to start the initialization process, as shown in FIG. 6.

In an embodiment, the initialization management component 113 can identify when one of the memory dies on the shared RB bus toggles from a low value to a high value indicating that one or more other memory dies received the command to start the initialization process. In response, the initialization management component 113 can identify a valid window and send a next initialization command.

Figure 7:
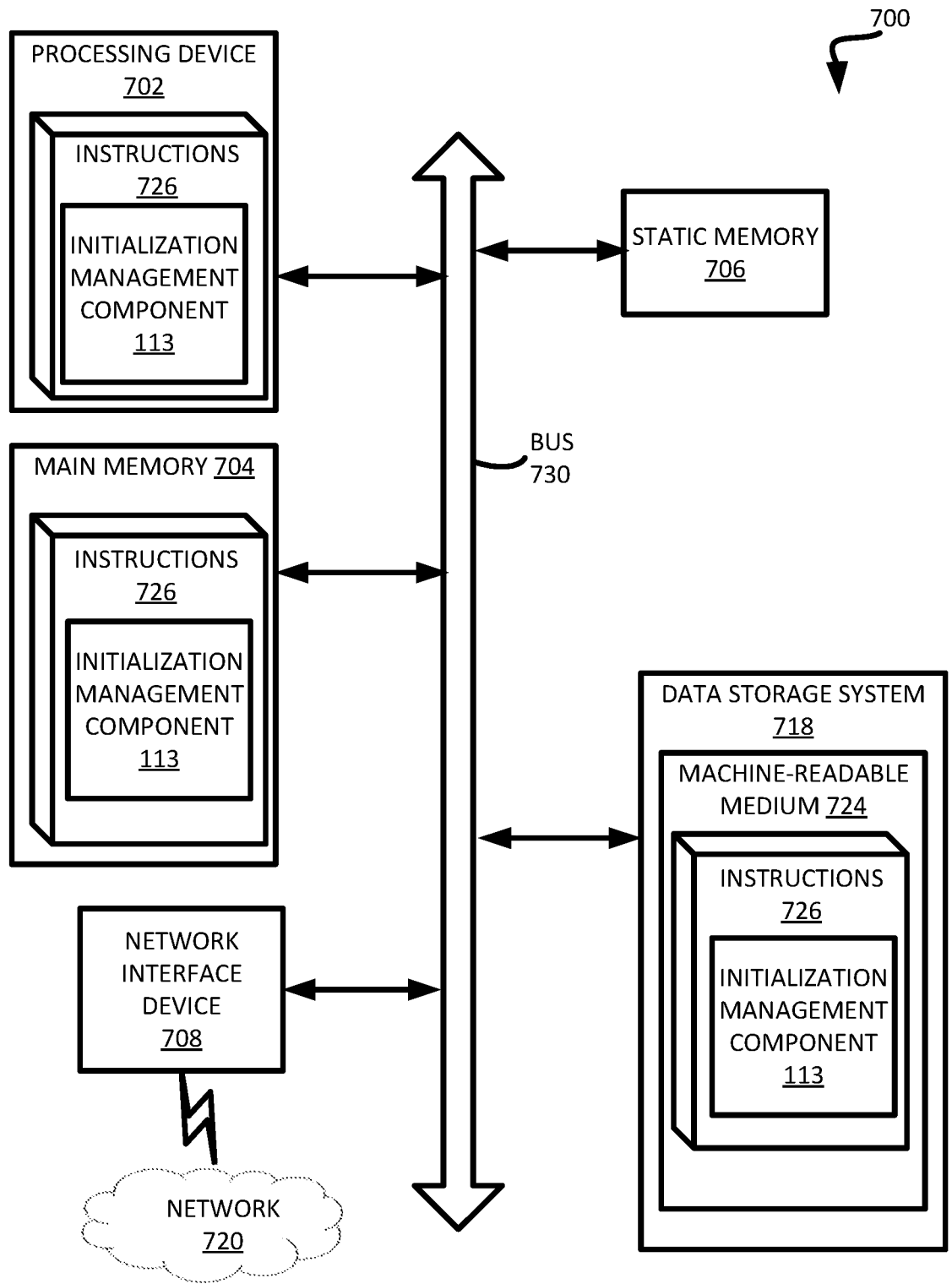
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a initialization management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a data protection component (e.g., the initialization management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer.

Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   sending, by a processing device, a first command to execute an initialization process on a first memory die of a plurality of memory dies of a memory sub-system;
   determining, in view of a measured parameter value satisfying a condition relating to a threshold parameter level, that the first memory die is in a low peak current draw phase of the initialization process;
   reading a bit value indicating that the first memory die is executing the low peak current draw phase of the initialization process; and
   in response to reading the bit value, sending a second command to a second memory die of the plurality of memory dies of the memory sub-system, the second command to execute the initialization process on the second memory die.

2. The method of claim 1, wherein the first memory die sets a status register bit to the bit value.

3. The method of claim 2, wherein the status register bit is set to a further bit value in response to the first memory die executing in a high peak current draw phase that comprises one or more peak current events having a level of current exceeding a threshold current level.

4. The method of claim 1, wherein a level of current consumed by the first memory die during the low peak current draw phase is below a threshold current level.

5. The method of claim 1, wherein the second memory die executes the initialization process in response to the second command.

6. The method of claim 1, wherein a high peak current draw phase is identified during a characterization phase associated with the first memory die.

7. The method of claim 1, further comprising:
   determining, by a parameter detector, that the measured parameter value associated with the execution of the initialization process by the first memory die.

8. A non-transitory computer readable medium comprising instructions, which when executed by a processing device, cause the processing device to perform operations comprising:
   sending, a first command to at least one memory die of a set of memory dies coupled via a shared ready busy (RB) output channel, the first command to execute an initialization process on the at least one memory die;
   determining, in view of a measured parameter value satisfying a condition relating to a threshold parameter level, that the at least one memory die is in a low peak current draw phase of the initialization process;
   reading a first bit value associated with the shared RB output channel, the first bit value indicating the at least one memory die is executing the low peak current draw phase of the initialization process; and
   in response to reading the first bit value, sending a second command to execute the initialization process to another memory die.

9. The non-transitory computer readable medium of claim 8, wherein the first bit value represents a composite ready busy value corresponding to the set of memory dies.

10. The non-transitory computer readable medium of claim 8, wherein the at least one memory die sets an RB value to one of the first bit value or a second bit value indicating the at least one memory die is executing a high peak current draw phase of the initialization process.

11. The non-transitory computer readable medium of claim 8, wherein a level of current consumed during the low peak current draw phase of the initialization process is below a threshold current level.

12. The non-transitory computer readable medium of claim 8, wherein the next memory die initiates execution of the initialization process in response to the second command.

13. The non-transitory computer readable medium of claim 8, the operations further comprising:
    determining, by a parameter detector, that the measured parameter value associated with execution of a phase of the initialization process.

14. A system comprising:
    a memory device; and
    a processing device, operatively coupled with the memory device, to perform operations comprising:
       sending a first command to execute an initialization process on a first memory die of a plurality of memory dies of a memory sub-system;
       determining, in view of a measured parameter value satisfying a condition relating to a threshold parameter level, that the first memory die is in a low peak current draw phase of the initialization process;
       reading a first bit value indicating that the first memory die is executing the low peak current draw phase of the initialization process; and in response to reading the first bit value, sending a second command to a second memory die of the plurality of memory dies of the memory sub-system, the second command to execute the initialization process on the second memory die.

15. The system of claim 14, wherein the first memory die sets a status register bit to one of the first bit value or a second bit value indicating the first memory die is executing a high peak current draw phase of the initialization process.

16. The system of claim 15, wherein the high peak current draw phase comprises one or more peak current events having a level of current exceeding a threshold current level.

17. The system of claim 14, wherein a level of current consumed by the first memory die during the low peak current draw phase is below a threshold current level.

18. The system of claim 14, wherein the second memory die initiates execution of the initialization process in response to the second command.

19. The system of claim 14, wherein the low peak current draw phase is identified during a characterization phase associated with the first memory die.

20. The system of claim 14, the operations further comprising:
   determining, by a parameter detector, that the measured parameter value associated with execution of a phase of the initialization process by the first memory die; and
   identifying the phase as the low peak current draw phase in view of the measured parameter value satisfying a condition pertaining to a threshold parameter level.

\* \* \* \* \*